United States Patent [19]

Bill et al.

[11] Patent Number: 5,311,130
[45] Date of Patent: May 10, 1994

[54] ELECTROMAGNETIC FIELD RADIATION DETECTOR HAVING AUDIBLE AND VISUAL INDICATORS FOR DETECTING FREQUENCIES WITHIN THE RANGE OF FIVE HERTZ TO FOUR HUNDRED KILOHERTZ

[75] Inventors: Richard Bill, Allegan; Enrique Rodriguez, Kentwood, both of Mich.

[73] Assignee: Rad Devices, Inc., Grand Rapids, Mich.

[21] Appl. No.: 27,621

[22] Filed: Mar. 8, 1993

Related U.S. Application Data

[63] Continuation-in-part of Ser. No. 869,464, Apr. 15, 1992.

[51] Int. Cl.$^5$ ............... G01R 33/02; G01R 33/06; G01R 35/00; G08B 21/00
[52] U.S. Cl. .................... 324/258; 324/133; 324/202; 324/251; 324/260; 340/326; 340/600
[58] Field of Search ............ 324/67, 72, 72.5, 95, 324/127, 133, 149, 244, 251, 258, 260, 344, 345; 340/600, 326; 250/250

[56] References Cited

U.S. PATENT DOCUMENTS

| | | |
|---|---|---|
| 3,296,494 | 1/1967 | Stenger, Jr. et al. . |
| 3,309,690 | 3/1967 | Moffitt . |
| 3,418,572 | 12/1968 | Humphreys, Jr. .................. 324/67 |
| 3,639,841 | 2/1972 | Richardson . |
| 3,679,908 | 7/1972 | Mazza . |
| 3,863,149 | 1/1975 | Johnson ...................... 324/133 X |
| 3,889,179 | 6/1975 | Cutler .................................. 324/326 |
| 3,927,375 | 12/1975 | Lanoe et al. . |
| 3,987,319 | 10/1976 | Nirschl . |
| 4,032,910 | 6/1977 | Hollway et al. . |
| 4,253,092 | 2/1981 | Connah, Jr. ................. 340/600 X |
| 4,338,595 | 7/1982 | Newman ....................... 340/600 |
| 4,386,315 | 5/1983 | Young et al. ................... 324/120 |
| 4,467,278 | 8/1984 | Toth et al. . |
| 4,488,115 | 12/1984 | Podhrasky ................. 324/133 X |
| 4,634,969 | 1/1987 | Edlin et al. ........................ 324/95 |
| 4,714,888 | 12/1987 | French et al. ................. 324/67 X |
| 4,714,915 | 12/1987 | Hascal et al. . |
| 4,724,390 | 2/1988 | Rauscher et al. ............. 324/72 X |
| 4,954,812 | 4/1990 | Lebron ......................... 324/260 X |
| 5,150,051 | 9/1992 | Freidman et al. ............. 324/258 |

OTHER PUBLICATIONS

Metz, Reinhard, Build This Magnetic Field Meter, *Radio Electronics*, Apr., 1991, pp. 33–38.

*Primary Examiner*—Gerard R. Strecker
*Attorney, Agent, or Firm*—Price, Heneveld, Cooper, DeWitt & Litton

[57] ABSTRACT

A system for detecting the presence of a magnetic field emanating from a video display terminal (VDT) in which a current induced through a sensing element is first amplified by a high gain amplifier stage having a very broad low band frequency response curve then rectified by a precision rectifier to convert the AC signal induced through the sensing element to DC current. The DC current is used as one input to a comparator, the other input being set by means of a potentiometer to provide flexibility in setting a threshold input voltage differential representative of a harmful magnetic field radiation level. The output of the threshold comparator triggers a driver which is connected to a battery powered solenoid. The solenoid actuates an indicator flag in the presence of a magnetic field which exceeds the threshold magnetic radiation level. To conserve battery energy, the energized solenoid also functions as a relay to break electrical contact between itself and the batteries simultaneously with actuating the flag indicator. An alternative embodiment invention replaces the pickup coil of the preferred embodiment with a Hall effect current sensor to sense the strength of the magnetic field. In a third embodiment of the invention a radiation detector is produced having astable multi-vibrators 250 and 256 which respectively produce an audible and visual warning signal.

3 Claims, 5 Drawing Sheets

ELECTROMAGNETIC FIELD RADIATION DETECTOR HAVING AUDIBLE AND VISUAL INDICATORS FOR DETECTING FREQUENCIES WITHIN THE RANGE OF FIVE HERTZ TO FOUR HUNDRED KILOHERTZ

This is a continuation-in-part of U.S. patent application Ser. No. 07/869,464 filed on Apr. 15, 1992.

TECHNICAL FIELD

The present invention relates to an apparatus for detecting the presence of a magnetic field of a particular strength and more particularly relates to an apparatus which provides a readily perceptible visual or auditory signal in response to a magnetic field of a particular strength emanating from a visual display terminal.

BACKGROUND ART

Video display terminals (VDTs) used with computers and in television sets give off propagating electromagnetic radiation composed of electric and magnetic components and an associated static electric field. Recently, the magnetic field component of this electromagnetic radiation has become the cause of public concern resulting in governmental regulation as to acceptable levels. Although others in the past have attempted to provide electromagnetic radiation detectors which measured harmful levels of energy emanating from microwave ovens and other high-power microwave devices used in domestic, industrial, medical and military applications, none of these prior devices are adapted to measure the extremely low frequency (ELF ranging from 5 to 2,000 hertz) and very low frequency (VLF ranging from 2,000 to 400,000 hertz) magnetic radiation which emanates from video display terminals.

Thus, an urgent need exists for a simple reliable device which can be attached to a video display terminal to warn people who work or live near video display terminals that a particular terminal emits a harmful level of low frequency magnetic radiation. Such a device should provide a low cost but foolproof method which is readily usable by lay persons to determine whether low frequency magnetic radiation leakage from a video display terminal exceeds the level proscribed by governmental standards.

It is a principal object of the present invention to provide a low cost device which is easily utilized by lay persons and is adapted to measure ELF and VLF magnetic radiation levels.

Another object of the present invention is to provide a a device adapted to indicate whether the level of magnetic radiation leakage from a video display terminal exceeds governmental standards.

SUMMARY OF THE INVENTION

In the present invention, a threshold value for magnetic field detection is set by adjusting a potentiometer. The presence of a magnetic field induces a current in a pickup coil which is first amplified by an operational amplifier and then rectified by a second operational amplifier. The output of the second amplifier is utilized as an input value to a third operational amplifier which compares this value to the threshold level set by means of the potentiometer. When the output value of the second operational amplifier reaches the level set by means of the potentiometer, the third operational amplifier produces output current which is used to trigger a fourth operational amplifier, a driver which actuates an electromechanical relay powered by batteries.

Thus according to one aspect of the present invention, an apparatus is described for indicating the presence of a magnetic field including a sensing means for sensing a magnetic field and generating an electric current in response to the magnetic field, an amplifying means for amplifying the current, a rectifying means for producing a unidirectional direct current, an adjustment means for setting a threshold current level which corresponds to a particular magnetic field strength, a comparing means for comparing the current level to the threshold level, an indicator means for indicating the presence of a magnetic field of a particular threshold level, and a switch driving means connected between the indicator means and the comparator means for transmitting the output of the comparator means to actuate the indicator means.

According to another aspect of the present invention, an apparatus is described for indicating to a user the strength of a magnetic field including a means for sensing the strength of a magnetic field by inducing a current, a means for amplifying said induced current, a means for comparing the induced current to a predetermined threshold value, and a means coupled to the comparing means for indicating to the user that the induced current exceeds the threshold level.

According to yet another aspect of the invention, isolation means is deployed between the comparison means and the sensing and amplification means in order to electrically isolate the induced current from the comparison means, thereby ensuring greater detection accuracy. Moreover, a voltage supply comprising two substantially similar sources in electrical and parallel assembly is utilized in order to increase the operational time of the detector.

The VDT Magnetic Field Detector is immediately applicable to detection of low frequency magnetic fields of a particular strength. Other objects, features and advantages will be apparent from the following description of a preferred embodiment of the present invention.

DETAILED DESCRIPTION OF THE PREFERRED EMBODIMENTS

Figure 1:
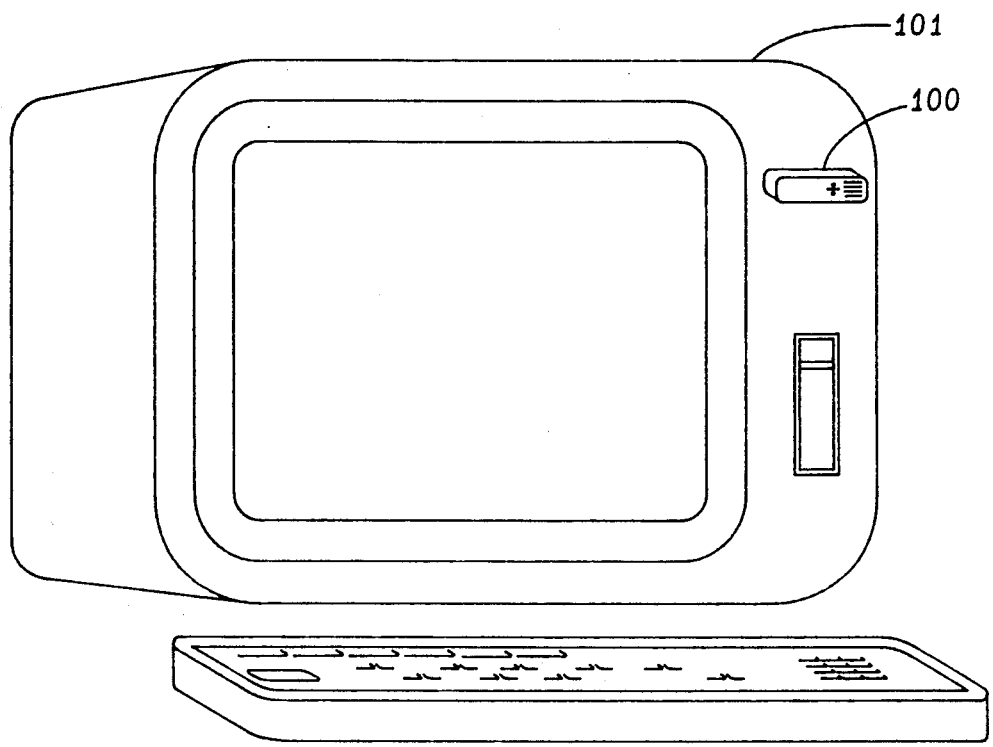
FIG. 1 is a perspective view of a miniaturized Video Display terminal (VDT) Magnetic Field Detector affixed to a video display terminal.
Figure 1A:
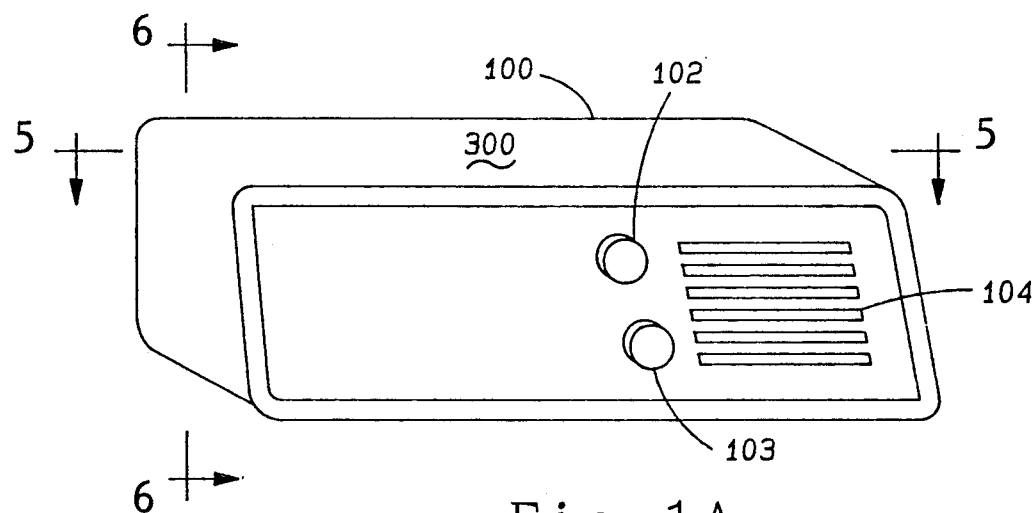
FIG. 1A depicts the flag indicator, test light and grille on the casing of VDT Magnetic Field Detector.

Referring now to the drawings wherein like reference numerals are used to reference identical components in various views, FIG. 1 depicts VDT Magnetic Field Detector 100 of the present invention affixed to the casing of video display terminal (VDT) 101. FIG. 1A depicts the casing of VDT Magnetic Field Detector 100 including flag indictor 102, test light 103, and grille 104.

Figure 2:
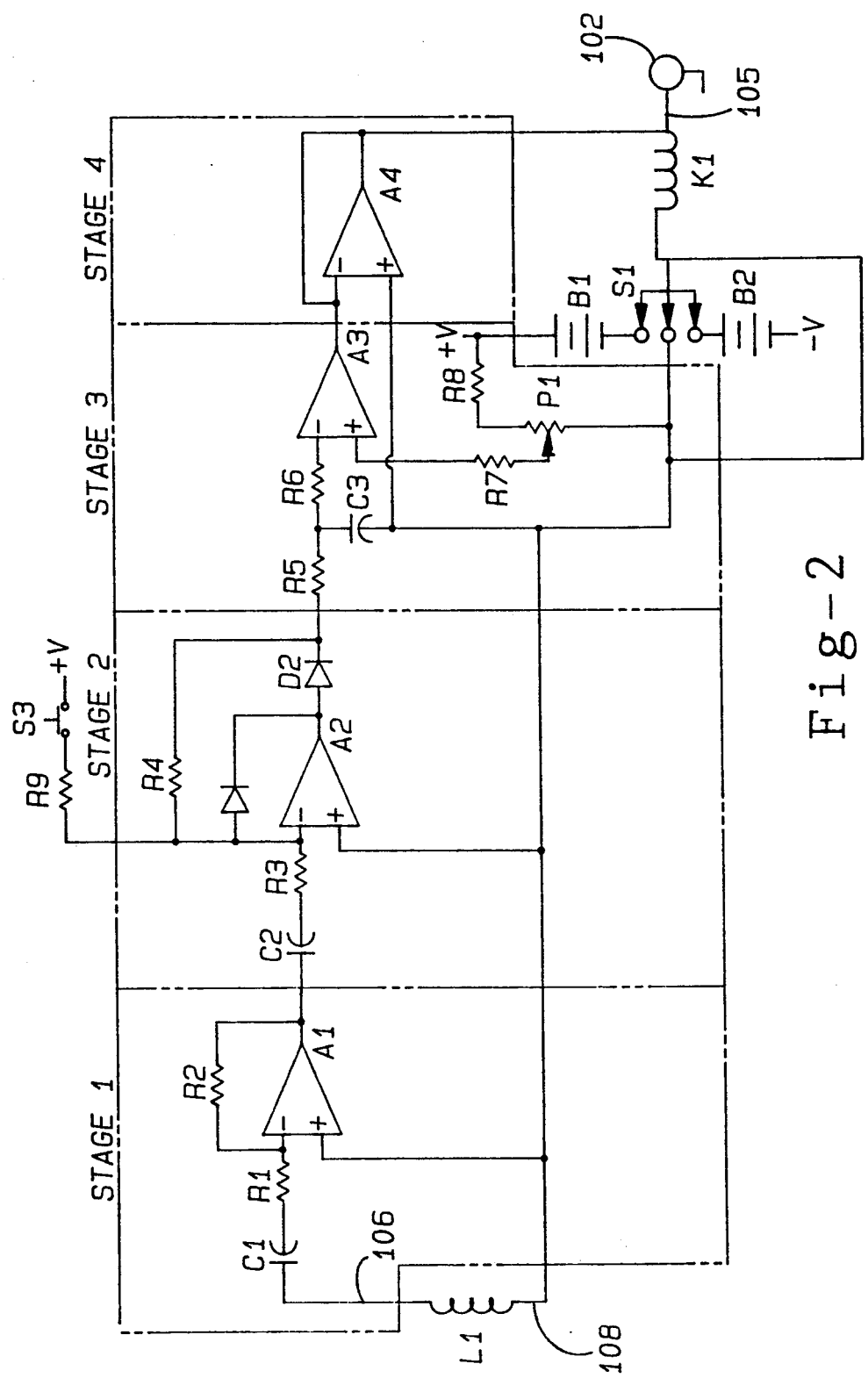
FIG. 2 is a schematic circuit diagram of the VDT Magnetic Field Detector of the present invention utilizing a pickup coil as a magnetic field sensor.

FIG. 2 is a schematic circuit diagram of VDT Magnetic Field Detector 100 of the present invention utilizing pickup coil L1 as a magnetic field sensor. A magnetic field emanating from VDT 101 passes unaffected through grille 104 inducing a current to flow through pickup coil L1 which is connected to stage one of VDT Magnetic Field Detector 100. Pickup coil L1 is preferably a 1" dia., 100 turn winding of 22 gauge wire. Stage one, which functions as a high gain amplifier, includes Operational Amplifier A1, resistors R1 and R2 and capacitor C1. Preferably the value of R1 is 10 ohms and the value of R2 is 1M ohms yielding a gain factor of 100,000 according to the basic amplification factor equation for an ideal inverting amplifier (feedback resistance/input resistance). Utilizing single capacitor C1 in series with pickup coil L1 provides a broad band low frequency response curve. The value preferred by the inventor for capacitor C1 is 0.1 μF. The values chosen for pickup coil L1 and capacitor C1 enable VDT Magnetic Field Detector 100 to measure magnetic field radiation in both the extremely low frequency (ELF, 5 to 2K Hz.) and very low frequency (VLF, 2K to 400K Hz.) ranges.

Stage two, a precision rectifier connected to stage one, includes operational amplifier A2, input resistor R3, feedback resistor R4, capacitor C2, and diodes D1 and D2. Stage two produces DC current from the AC signal induced in pickup coil L1 as a result of the time varying magnetic field emitted from VDT 101. A precision rectifier is used because the signal or current induced in pickup coil L1 is quite small even after amplification by a factor of 100,000 by operational amplifier A1. Because individual diodes are manufactured within a range of allowable input voltages to forward bias the device, if conventional diodes were used without supporting operational amplifier A2, the extremely small signal output from stage one would likely fall within the input voltage tolerance or range of allowable values. The induced signal would become indistinguishable from the operational input voltage variance of diodes D1 and D2. Functional test switch S3 provides a battery power test capability to reassure the user that batteries B1, B2 are energized and that the circuit is not shorted. The stage two component values preferred by the inventor are: input resistor $R3 = 10K$ ohms, feedback resistor $R4 = 100K$, resistor $R9 = 100K$, and capacitor $C2 = 0.001$ μF.

Stage three, a comparator connected to the output of operational amplifier A2 and batteries B1 and B2, includes operational amplifier A3, input resistors R5, R6, R7, and R8, and potentiometer P1. Potentiometer P1 provides flexibility in setting a threshold input voltage at which to trigger output from comparator operational amplifier A3. Capacitor C3 is charged by the DC output of operational amplifier A2. Connecting capacitor C3 across the input of operational amplifier A3 results in a decrease in input voltage variation and the ripple effect in the current produced by the precision rectification of stage two. Stage three components values preferred by the inventor are: input resistors $R5 = 100K$, $R6 = 100K$, $R7 = 100K$, and $R8 = 100K$.

Stage four is comprised of a driver in the form of operational amplifier A4. The output of operational amplifier A4 is connected to solenoid/relay K1. Operational amplifier A4 is used in an inverting configuration preferably with a gain of one (0 feedback resistance/0 input resistance). This stage acts merely as a buffer which tends to isolate relay K1 from any harmful output characteristics of operational amplifier A3. Using operational amplifier A4 as a driver also improves power delivery or transfer to relay K1. Operational amplifiers are typically packaged in groups of four. The design of the present invention is cost effective in that it utilizes all four amplifiers in a single package.

Relay K1 is powered by batteries B1, B2 and triggered by the output of operational amplifier A4. Integral with relay K1 is tri-switch S1 which functions as a solenoid to break electrical contact between relay K1 and batteries B1, B2 when flag indicator 102 has been actuated. Before a threshold magnetic field is sensed in pickup coil L1, very little current flows in the entire circuit. Once a current sufficient to trigger operational amplifier A3 has been induced in pickup coil L1, a relatively larger amount of current will begin to flow through K1. If the higher current level is sustained for some time, batteries B1 and B2 will discharge. Therefore, relay K1 and tri-switch S1 have been designed such that when relay K1 is energized, core 105 of the relay K1 is pulled toward the center of relay K1. Attached to core 105 is flag indicator 102 and tri-switch S1. Movement of core 105 is flag indicator 102 and tri-switch S1. Movement of core 105 activates flag indicator 102 and simultaneously causes tri-switch S1 to disconnect batteries B1 and B2 from the circuit. No additional power is required to maintain flag indicator 102 in its actuated position. Flag indicator 102 may be reset manually. Because the circuit draws no additional power until relay K1 is reset, energy stored in batteries B1, B2 is conserved. Thus, constructing relay K1 integral with tri-switch S1 conserves energy stored in batteries B1, B2. Relay K1 is a unique improvement over conventional relays and is not available as a standard component.

Figure 3:
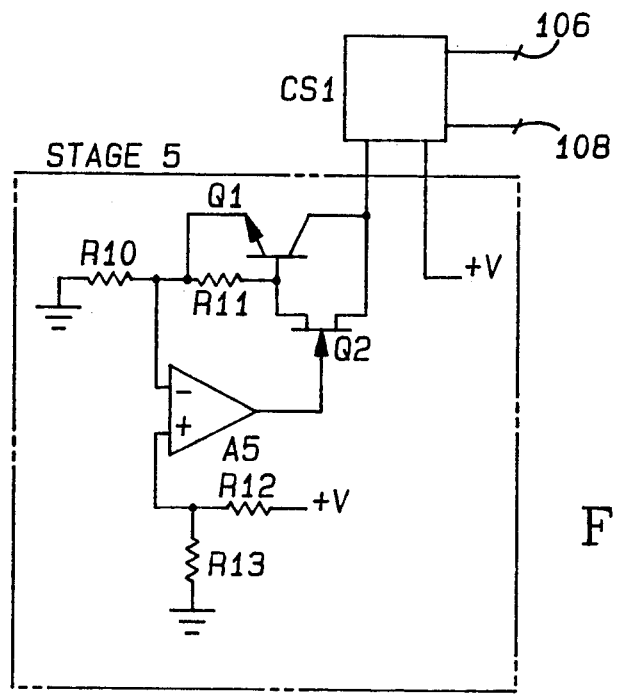
FIG. 3 is a schematic of an alternative embodiment of the VDT Magnetic Field Detector utilizing a Hall effect current sensor as a magnetic field sensor.

An alternative embodiment of the present invention depicted in FIG. 3 replaces pick up coil L1 with Hall effect current sensor CS1 as the magnetic field sensing element. A Hall effect current sensor outputs voltage proportional to a magnetic field provided that a constant current is properly applied. The design for a constant current source preferred by the inventor is shown as stage five. Stage five is comprised of operational amplifier A5, NPN transistor Q1, field-effect transistor Q2, and resistors R10, R11, R12, and R13. Stage five, functioning as a constant current source for Hall effect current sensor CS1, is connected directly in place of L1 in FIG. 2 at connection points 106 and 108. Stage five can be modeled as a Norton equivalent constant current source producing a current $I_{out}$ 110, preferably 20 mA. Preferred transistor model numbers are: $Q1 = 2N2219$, Q2 2N4867, while the preferred Hall effect current sensor model number is: $CS1 = $ F. W. Bell FH 301 which has a magnetic field sensitivity of 12 mV per kiloGauss. Voltage sources preferred are $+$, $-3$ V.

Other alternative embodiments could replace flag indicator 102 with either an audio indicator signal, an alternate visual indicator such as an LED or any type of low voltage lamp. All components depicted in the present invention, VDT Magnetic Field Detector 100, are standard (off-the-shelf) components unless expressly mentioned otherwise.

Figure 4:
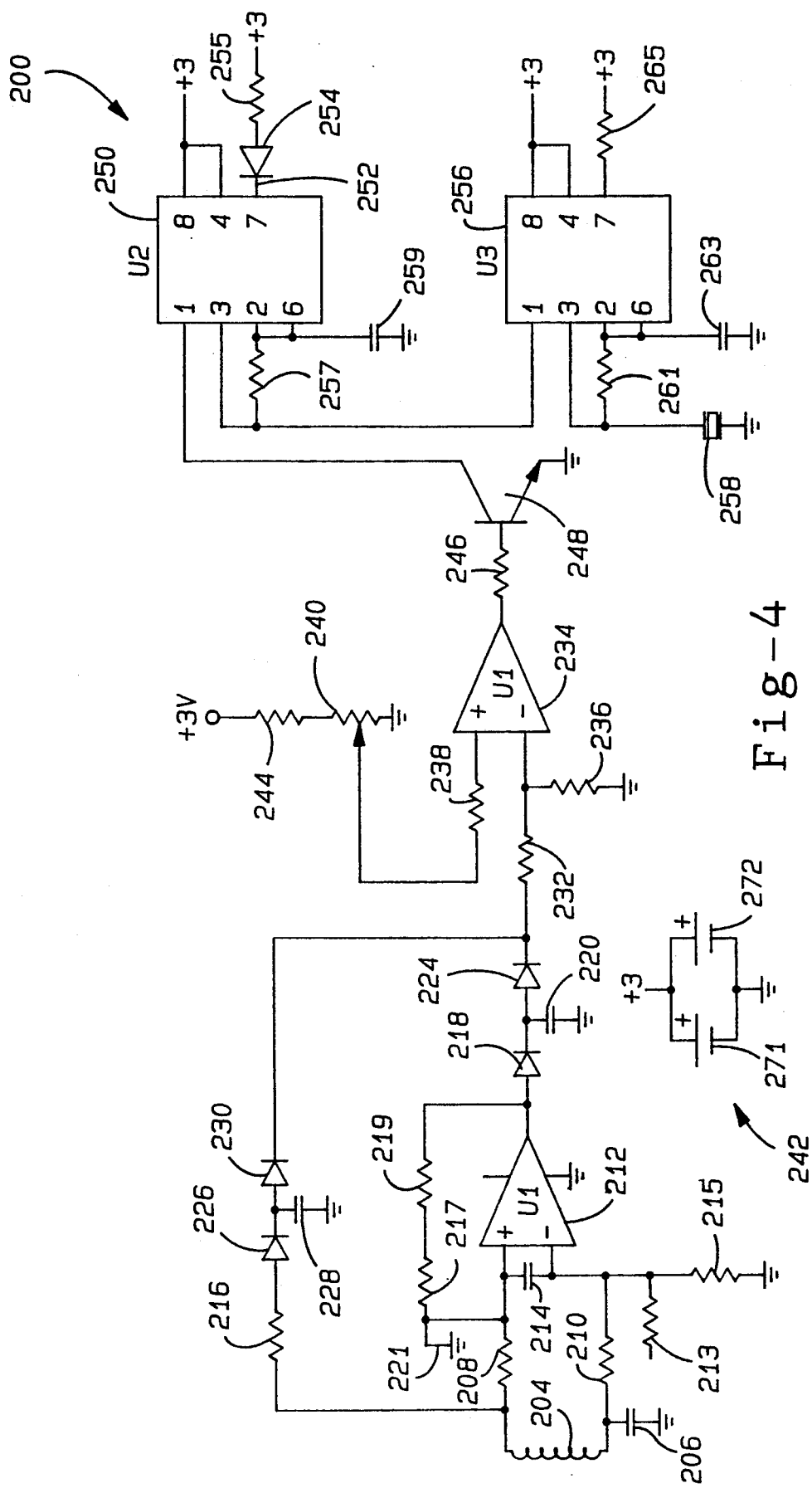
FIG. 4 is a schematic circuit diagram of a magnetic field detector made in accordance with the teachings of a third embodiment of this invention.

Referring now to FIG. 4, there is shown a third magnetic field detector circuit 200 including an inductance coil 204 coupled to electrical ground by capacitor 206. Inductor 204 senses a magnetic field having a frequency in the range of about 5 hertz to about 400,000 hertz and generates an electrical alternating current.

Circuit 200 further includes resistors 208 and 210 which are respectively coupled to coil 204 and capacitor 206 and which are mutually coupled to operational amplifier 212 by capacitor 214. As should be apparent to one of ordinary skill in the art, resistors 208 and 210 cooperate with capacitor 214 to form a low pass filter which causes the electrical signal emanating from inductor 204 and associated with magnetic radiation having a frequency of about 2,000 to about 400,000 hertz to be applied to resistor 216. Electrical current associated with frequencies in the range of about 5 hertz to about 2,000 hertz will be coupled to and amplified by operational amplifier 212.

Resistors 213 and 215 are coupled to resistor 210, capacitor 214, and amplifier 212 and are further respectively coupled to voltage source 242 and electrical ground. Further, resistors 217 and 219 are coupled in series and provide a feedback path from the output of amplifier 212 to its input. Switch 221 is coupled to electrical ground and amplifier 212 is coupled to source 242. It should be apparent to one of ordinary skill in the art that resistors 213, 215, 217, 219, capacitor 206, and source 242 bias amplifier 212 in order to obtain desired amplification.

The amplified current emanating from amplifier 212 is rectified by the combination of diode 218 and capacitor 220, which is coupled to the output of diode 218 and to electrical ground. The rectified current is coupled to isolation diode 224. Electrical current associated with the higher frequency magnetic radiation is rectified by the combination of diode 226 and capacitor 228 and coupled to isolation diode 230. The outputs of isolation diodes 224 and 230 are summed and coupled to resistor 232. Such summing is achieved by mutually coupling the outputs of diodes 224 and 230. In this manner, isolation diodes 230 and 224 isolate inductor 204 and amplifier 212 from other portions of circuit 200 thereby substantially preventing electrical signals from these other circuit portions from modifying or corrupting the signals output from inductor 204 and/or amplifier 212. Accordingly, isolation diodes 224 and 230 increase magnetic field detection accuracy.

As shown, resistor 232 is coupled to operational amplifier comparator 234 and to electrical ground through resistor 236. Comparator 234 is also coupled through resistor 238 to an adjustable resistor or potentiometer 240 which is coupled to a voltage source 242 through "pull-up" resistor 244.

In this manner, as should be apparent to one of ordinary skill in the art, the amplitude of the summed signal after passing through resistor 232 is compared with a predetermined threshold value which is determined by the setting of potentiometer 240 and the value of resistor 244. Should this amplitude exceed the threshold value, amplifier 234 generates a signal to current limiting resistor 246. In this manner, the generated signal is applied to the base of the bipolar transistor 248 having an emitter terminal coupled to electrical ground and a collector terminal coupled to an astable multi-vibrator 250.

Upon the transmission of the signal output from comparator 234 to the base of transistor 248, the collector terminal of transistor 248 outputs a logically high signal to multi-vibrator 250. Light emitting diode 254 has an input coupled to source 242 through resistor 255 and an output terminal coupled to multi-vibrator 250. Upon receipt of a logically high signal from transistor 248, multi-vibrator 250 allows current to flow through diode 254 from source 242, thereby causing light to be emitted from diode 254. Therefore, multi-vibrator 250 and light emitting diode 254 cooperate to provide a visual indication when current is output from comparator 234. Such current is output only when the amplitude of the current input to amplifier 234 exceeds a predetermined threshold value, indicating that a magnetic field having a frequency between about 5 hertz and about 400,000 hertz is present. Resistor 257 and capacitor 259 which are mutually coupled to multi-vibrator 250 and which are respectively coupled to multi-vibrator 256 and electrical ground determine the amplitude of the signal applied to multi-vibrator 256 by vibrator 250.

That is, as further shown, multi-vibrator 250 is coupled to a second and substantially identical multi-vibrator 256 and provides a logically high signal to multi-vibrator 256 when light emitting diode 254 has been activated. Multi-Vibrator 256 is further coupled to source 242 through resistor 265 and to audio generator 258 through resistor 261. Capacitor 261 further couples multi-vibrator 256 and resistor 259 to electrical ground.

In this manner, multi-vibrator 256, upon receipt of a signal from multi-vibrator 250, activates an electric audio generator 258, thereby providing an audio signal indicating the presence of a certain magnetic field. Capacitor 263 and resistor 261 determine the amount of current applied to speaker 258. In this manner, it should be apparent to one of ordinary skill in the art that astable multi-vibrators 250 and 256 cooperate to provide both visual and audible warning signals of the presence of a magnetic field having a frequency within a certain predetermined range. Lastly, depression of switch 221 causes electrical noise to be amplified and compared in the previously-described manner, thereby activating diode 254 and speaker 258. Such noise may therefore be used to test circuit 200. Moreover, use of two substantially identical and parallel sources 271 and 272 allows circuit 200 to operate for a substantially longer period than do the other two embodiments. It should be apparent to one of ordinary skill in the art that source 242 may be replaced by a conventional photocell.

It is preferred that the following component values be employed in this third embodiment:

| COMPONENT | VALUE |
|---|---|
| 206 | 0.1F |
| 208 | 1kΩ |
| 210 | 100Ω |
| 213 | 1mΩ |
| 214 | 0.1F |
| 215 | 100kΩ |
| 216 | 1kΩ |
| 217 | 47kΩ |
| 219 | 220kΩ |
| 220 | 10μF |
| 232 | 1kΩ |
| 236 | 100kΩ |
| 238 | 100kΩ |
| 240 | 100k Limit |
| 244 | 220kΩ |
| 246 | 10kΩ |
| 255 | 220Ω |

-continued

| COMPONENT | VALUE |
| --- | --- |
| 257 | 220kΩ |
| 261 | 1kΩ |
| 265 | 10kΩ |

Figure 5:
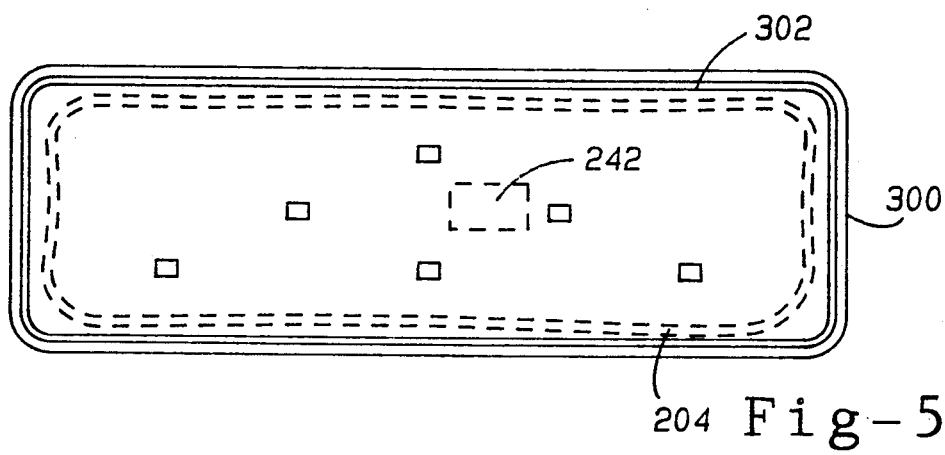
FIG. 5 is a top sectional view of the detector shown in FIG. 1A taken in the direction of view line 5—5.
Figure 6:
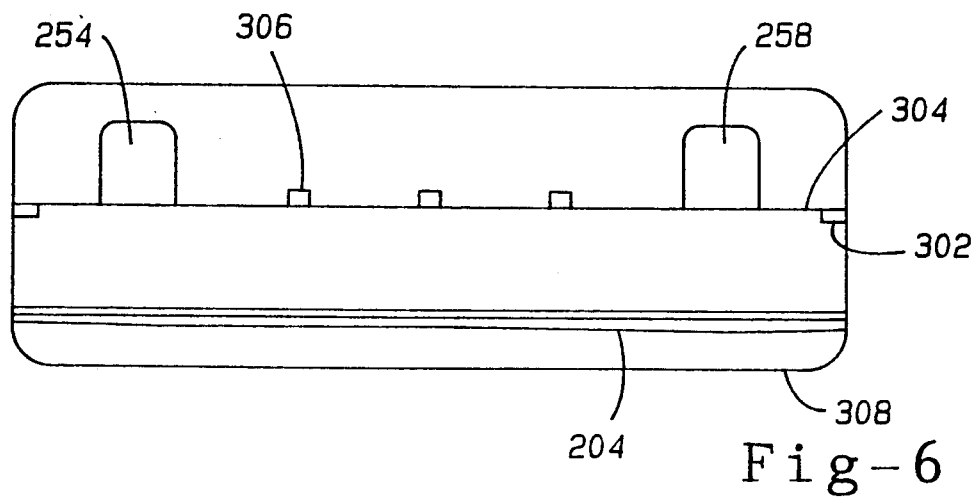
FIG. 6 is a side sectional view of the detector shown in FIG. 1A taken in the direction of view line 6—6.

In order to provide a magnetic field detector of a relatively small and efficient shape which could be easily mounted upon a video display terminal, the various electrical components shown in circuit 200 are packaged in the manner shown in FIG. 5 and 6.

Specifically, mounting case 300 includes a circumferentially and inwardly protruding edge 302 upon which a circuit board 304 is mountably supported. Circuit board 304, as shown best in FIG. 6, includes light emitting diode 254, audio generator 258, and various other components 306 which are substantially identical to each of the components 206-258. Moreover, coil 204 is mounted below circuit board 304 and, in the preferred embodiment of this invention, is removably secured to the bottom surface 308 by conventional electrical component mounting and retention means. Moreover, supply 242 is also mounted to the bottom of case 300 within coil 204. Such mounting may be achieved by conventional mounting means. In this manner, circuit 200 may be packaged in an efficient and compact manner.

Figure 7:
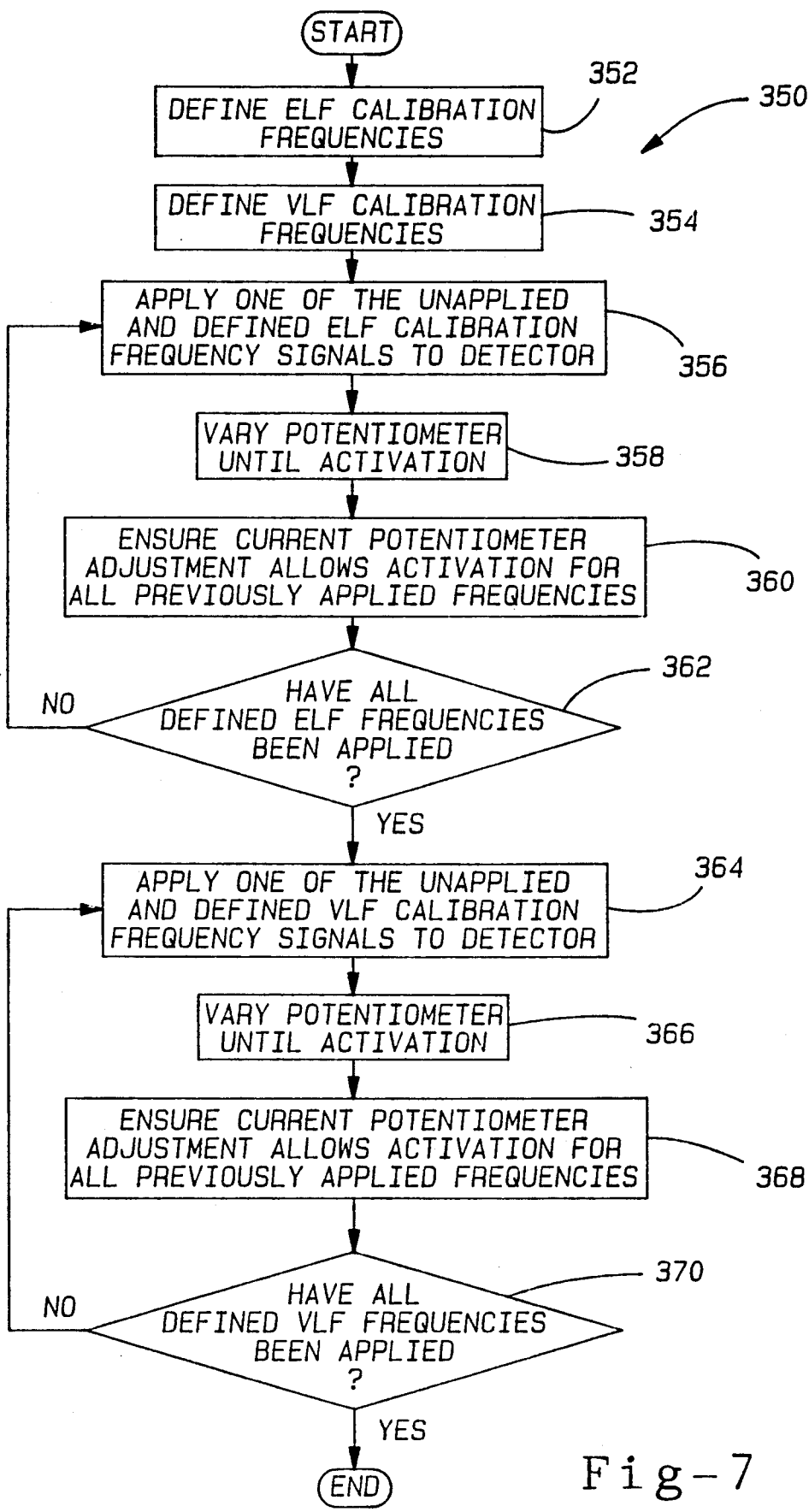
FIG. 7 is a flowchart illustrating a sequence of steps used to calibrate the detector of the invention.

Referring now to FIG. 7, there is shown a flowchart 350 illustrating the sequence of steps necessary to calibrate the detector shown in FIG. 5. Such calibration, in the preferred embodiment of the invention, is necessary to ensure that frequencies within the range of about 5 hertz to about 400,000 hertz cause circuit 200 to provide a visual and audio output. Specifically, in step 352 a number of calibration frequencies are defined in the frequency range of about 5 hertz to about 5,000 hertz. In step 354 several calibration frequencies are defined in the frequency range of about 5,000 hertz to about 400,000 hertz.

In step 356, one of the unapplied and previously-defined frequencies of step 352 is applied to detector 200. In step 358, potentiometer 240 is varied until light emitting diode 254 and generator 258 produce respective video and audible alarm signals.

In step 360, it must be ensured that the current potentiometer setting causes light emitting diode 254 and audio generator 258 to produce their respective signals upon receipt of any and all of the previously-applied signals. This is done by applying each of the previously-applied signals to circuit 200 having the potentiometer setting of 358. If such activation is not achieved, potentiometer 240 is varied until all of the frequencies use the desired activator. Step 362 requires a user to determine if all previously-defined signals, associated with step 352, have been applied to detector 200. If these have not been all applied, step 360 is followed by step 356. Alternatively, step 362 is followed by step 364.

In step 364, one of the unapplied and previously-defined calibration frequency signals, associated with step 354, is applied to detector 200. Step 366 follows step 364 and, in this step, potentiometer 240 is varied until light emitting diode 254 and generator 258 produce their respective warning signals. In step 368, a user of circuit 200 must ensure that the current potentiometer settings are effective to activate light emitting diode 254 and generator 258 for every signal which has previously been applied to circuit 200. In step 370, a user must determine whether all of the frequencies, defined in step 354, have been applied to circuit 200. If all such frequencies have not been applied, step 370 is followed by step 364. Alternatively, calibration routine 350 is ended. In this manner, it should be apparent to one of ordinary skill in the art, that certain frequencies within two frequency ranges are selected and are sequentially applied to circuit 200 in a manner which will allow the circuit to provide an audio and visual warning indication upon the application of these signals.

It is to be understood that the invention is not limited to the exact construction or method illustrated and described above, but that various changes and modifications may be made without departing from the spirit and scope of the invention as set forth in the following claims.

What is claimed is:

1. A radiation detector adapted to detect and provide a warning of a presence of radiation having a frequency of about 5 hertz to about 400,000 hertz, said radiation detector comprising:
   coil means for sensing said radiation and for producing an alternating electrical current signal when said radiation is sensed;
   amplifier means, coupled to said coil means, for amplifying said alternating electrical current signal only when said frequency of the sensed radiation is less than about 2,000 hertz, thereby producing an amplified signal;
   first rectification means, coupled to said coil means, for rectifying said alternating electrical current signal only when said frequency of the sensed radiation is greater than about 2,000 hertz, thereby for producing a first direct current signal;
   second rectification means, coupled to said amplifier means, for rectifying said amplified signal, thereby producing a second direct current signal;
   summing means, coupled to said first and second rectification measure, for summing said first and second direct current signals, thereby producing a summed signal;
   comparator means, coupled to said summing means, for comparing said summed signal to predetermined value and for producing a comparison output signal only when said summed signal exceeds said predetermined value;
   first multi-vibrator means, coupled to said comparator means, for selectively producing a visual alarm signal only when said comparison output signal is produced by said comparator means; and
   second multi-vibrator means, coupled to said first multi-vibrator means, for selectively producing an audible alarm signal a predetermined time after said visual alarm signal is produced, thereby cooperating with said first multi-vibrator means to provide a warning of said presence of said radiation.

2. The radiation detector of claim 1 further comprising power supply means for supplying electrical power to said amplifier means, comparator means, and to said first and second multi-vibrator means.

3. The radiation detector of claim 2, wherein said power supply means comprises a first battery, and a second battery coupled in parallel to said first battery.

* * * * *